United States Patent [19]

Mino et al.

[11] Patent Number: 4,551,408

[45] Date of Patent: Nov. 5, 1985

[54] COLOR IMAGE FORMING METHOD AND COLOR IMAGE FORMING PHOTO-SENSITIVE MATERIAL TO BE USED THEREFOR

[75] Inventors: Hisashi Mino, Saitama; Takeshi Iizima, Higashimatsuyama, both of Japan

[73] Assignee: Sanyo-Kokusaku Pulp Co., Ltd., Tokyo, Japan

[21] Appl. No.: 538,881

[22] Filed: Oct. 4, 1983

[30] Foreign Application Priority Data

Oct. 7, 1982 [JP] Japan ................. 57-176752

[51] Int. Cl.[4] ................. G03C 5/18; G03C 5/00; G03F 7/08
[52] U.S. Cl. ................. 430/141; 430/5; 430/145; 430/291; 430/292; 430/294
[58] Field of Search ............... 430/145, 291, 292, 294, 430/141, 5

[56] References Cited

U.S. PATENT DOCUMENTS 4,374,193  2/1983  Moriya et al. .................. 430/294

Primary Examiner—Mary F. Downey
Assistant Examiner—Mukund J. Shah
Attorney, Agent, or Firm—Armstrong, Nikaido, Marmelstein & Kubovcik

[57] ABSTRACT

A color image forming method wherein a colored, water soluble polymer and a photo-sensitive polymerization initiator are layered upon a transparent base material, exposed to light through a negative original, washed with water to remove unpolymerized material, proofed, and then dyed to an optical density of at least 2.5.

1 Claim, No Drawings

COLOR IMAGE FORMING METHOD AND COLOR IMAGE FORMING PHOTO-SENSITIVE MATERIAL TO BE USED THEREFOR

DETAILED DESCRIPTION OF THE INVENTION

This invention relates to a color image forming method and a photo-sensitive material to be used in carrying out the method and particularly to an image forming method and for a photo-sensitive material whereby the proof work and contact reversing work, which are indispensable to a photo-mechanical process, can be carried out on the same photo-sensitive material.

With the exception of the so-called printing method (a proof machine), the proof work in the photo-mechanical process has heretofore been carried out in varied methods including (1) a method of taking a copy on a diazo photo-sensitive paper; (2) a method of forming a color image on a transparent film; (3) a method of transferring a color photo-sensitive material onto an opaque carrier material and repeating the exposure and developing processes; and (4) a method of using a coloring toner according to the electrophotography. However, the method (1) is not applicable to the color proof work, which is indispensable to color printing, although it can be carried out at a low cost. The methods (2)–(4) are applicable to color proof work. However, they result in a relatively high running cost as well as a high cost of materials. In addition to such disadvantages, it is their common disadvantages, in terms of economy, that the material used for the proof work must be discarded after use.

The contact reversing work is also indispensable to the photo-mechanical process. Various kinds of non-silver salt type photo-sensitive materials for contact reversing work have recently been disclosed. It is essential for such photo-sensitive materials to have the characteristics of lith film. In other words, the image obtainable from these materials must excell in dot quality and gradation half-tone reproducibility. The image density must be sufficiently high to permit printing onto a PS plate or other lith films. Among the conventional photo-sensitive materials, silver salt type photo-sensitive materials have most often been used for this purpose on account of their high sensitivity, high contrast and ability to readily give high density images. However, use of them necessitates use of a special developing solution for treating them. Besides, such developing solutions are unstable and have short service lives. Therefore, the developing solution must be used with a considerable degree of care to obtaining a uniform image. Meanwhile, their high sensitivity necessitates work in a dark room, which is disadvantageous in respect to working conditions and environment. It is a further disadvantage of the conventional silver salt type photo-sensitive materials that the silver halide to be used for them is expensive. Hence, the availability of less expensive materials have been desired at least partly for saving silver resources.

In an attempt to meet the above stated requirement, the present inventors strenuously conducted studies. As a result of these studies, they have found a color image forming method and a photo-sensitive material that is usable for the method. In accordance with this method, both the proof work and the contact reversing work can be accomplished on the same material. In other words, in accordance with the method, the same material is capable of performing the function of a material for the proof work and also the function of a material as a lith film. The method permits reduction in cost of materials and operation. Besides, compared with the silver halide, the photo-sensitive material is not expensive. It is a further advantage of the method that all the processes required can be carried out in a day-light room. The developing and fixing work can be accomplished with water on an aqueous solution of a dye without having recourse to an organic solvent the latter being disadvantageous in view of environmental problems and the fear of an explosion. Further, the aqueous solution does not deteriorate due to oxidation, so that it can be used over a long period of time.

More specifically stated, the present invention provides a color image forming method characterized in that a photo-sensitive material which has a water soluble color layer arranged on a transparent base material and which is insolubilized by light is processed by the steps of:

(1) carrying out a contact exposure by exposing, via a negative original, the photo-sensitive material to rays of light which insolubilize the material and then having the non-exposed portion of the color layer melted and removed by washing the material with water to form an image thereon, and (2) dyeing the image thus formed with an aqueous solution of a dye; the colorant and dye being selected such that the optical transmission color density of said image is within a range from 0.5 to 1.5 at the completion of step (1) and to be at least 2.5 within the range of the active rays of light, at the completion of the dyeing step (2).

Further, the invention also provides a color image forming photo-sensitive material wherein a water soluble color layer is arranged on a transparent base material and which is insolubilized by light; the photo-sensitive material is adapted for use in accordance with a color image forming method comprising the steps of (1) carrying out a contact exposure by exposing, via a negative original, the photo-sensitive material to rays of light active on the material and then having a non-exposed portion of the color layer melted and removed by washing the material with water to form an image thereon and (2) dyeing the image thus formed with an aqueous solution of a dye, the optical transmission color density of the image being arranged to be within a range from 0.5 to 1.5 at the step (1) and to be at least 2.5 within the range of the active rays of light at the step (2); the color layer which is insolubilizable by light is mainly composed of a film forming, water soluble high polymer, a light insolubilizing agent and a coloring agent; and, at the end of the step (1), the optical transmission color density is within the range of 0.5–1.5.

The features of the invention will become apparent from the following detailed description. The transparent base material usable for the photo-sensitive material according to the invention may be selected from transparent plastic films such as films of polyethylene terephthalate, polypropylene, polyethylene, polyvinyl chloride, polystyrene, polycarbonate, triacetate, etc. Of these films, use of a biaxially stretched film of polyethylene terephthalate is preferable as it excels in strength, dimensional stability, and transparency. There is no particular limitation to the thickness of the base or carrier material. However, a preferred thickness is between 50 and 150$\mu$ or thereabout.

The color layer, which is arranged to be insolubilized by light on the base material, is formulated in the following manner. In the past, varied kinds of subtances that can be insolubilized by light have been proposed and used. In the case of the present invention, selection of such a substance has been made from a wide range of substances on the conditions that the substance must permit elution by means of water only in carrying out the step (1) and also must give an opaque image of image density at least 2.5 at the completion step (2). As a result of such researches, it has been discovered that a combination of a film forming, water-soluble high polymer, a light insolubilizing agent and a coloring agent is most suitable for the color layer that is to be insolubilized by light.

The above stated film-forming, water-soluble high polymer may be selected from the group consisting of polyvinyl alcohol; gelatin; casein; glu-alginates; gums; cellulose derivatives such as carboxyl methyl cellulose, hydroxy methyl cellulose, etc.; polyacrylic acid and its salts; polymetacrylic acid and its salts; poly-acryl amide, poly-ethylene oxide; poly-vinyl pyrolidone; etc. As for the light insolubilizing agent which is to be used for causing these substances to be insolubilized by light, it is conceivable to select the agent from the group consisting of a diazonium salt and its condensation product; a tetrazonium salt; a dichromate; and various combinations thereof. The present inventors have closely examined all the conceivable combinations of these substances in terms of photo-sensitivity (velocity of light insolubilization), developing property (washability with water), dyeability (dyeing velocity of an aqueous solution of a dye on a film formed after the insolubilization by light), storage stability, the strength and water resistance of the film after insolubilization by light and other properties relative to safety. Then, it has been found that these requirements can all be satisfied by the use of the polyvinyl alcohol, gelatin, polyacrylamide, their copolymers or their mixture which is employed as the above stated water-soluble high polymer is combination with the condensation product of diazonium salt, and particularly the formalin condensation product of *para*-diazo-diphenylamine which is employed as a light insolubilizing agent.

The above stated combination satisfies all the requirements concerning the photo-sensitivity, dyeability, etc. The addition ratio of the light insolubilizing agent to the above stated water-soluble high polymer is between 2 and 20% and more preferably between 5 and 12%. As regards the coloring agent, any pigment that is dispersible in water is usable provided that it has a good affinity with the water soluble high polymer and the light insolubilizing agent and that it must not affect the photo-sensitivity and the developing property. In the case of color proof work in a photo-mechanical process, the color tone of the coloring agent basically includes cyan, magenta, yellow and black. A color close to a printing ink is naturally preferred. Although it depends on the kind and the amount of the color layer, the addition quantity of the coloring agent is determined in such a manner that, at the end of the above stated step (1), the image formed is light transmissive and essentially the optical transmission color density of the image formed is between 0.5 and 1.5.

A careful consideration is required for the dispersion of the coloring agent or pigment. For example, the particle size of the coloring agent is preferably as small as possible for good resolution. A water-soluble dye may be employed as the coloring agent. In such a case, however, the dye and the above stated light insolubilizing component and particularly the light insolubilizing agent generally have insufficient mutual solubility, primarily because of many added inorganic salts, and this tends to result in lower photo-sensitivity and lower storage stability. Further, in such a case, an exposed portion of the material (a light insolubilized portion) tends to be melted by the effect of the dye even during the process of development. Therefore, use of such a dye is undesirable.

In addition to the above stated components, the color layer which is to be insolubilized by light may have the following agents added thereto: A stabilizer for preventing a dark reaction; and a levelling agent, defoaming agent and/or a surface active agent for improved coating property in applying the color layer to the transparent base material.

In applying the color layer to the base material, the above stated components are preferably dissolved and dispersed in water and are thus mixed together. However, if necessary, a water-soluble organic solvent such as alcohol may be partly used as diluent for the purpose of anti-foaming and improvement in the coating property.

The thickness of the color layer is preferably as thin as possible in respect of resolution or gradation half-tone reproducibility, etc. while the layer is preferably as thick as possible with respect to the dyeability required for the above stated step (2). Taking the two contradicting requirements into consideration, the optimum thickness of the color layer is set at a value between 2 and $5\mu$. While the color layer may be applied directly to the surface of the transparent base material, an intermediate layer may advantageously be interposed in between them for the purpose of attaining improved adhesion. The color layer according to the present invention sometimes has insufficient adhesion to the base material, particularly where the base material is made of a polyethylene terephthalate film. In such a case, therefore, it is preferable to have an intermediate layer (i.e. a primer layer) principally consisting of a synthetic resin such as a polyester, polyvinylidene or polyurethane resin.

In coating the transparent base material with the above stated color layer or the intermediate layer, any known coating method may be employed as long as the method employed ensures a uniform coating without any pin holes.

The color image forming photo-sensitive material obtained in accordance with this invention is contact exposed to rays of light, which is active on the photo-sensitive material, with the contact exposure being effected through a negative film (a negative original) which has been obtained through half-tone separation carried out for each separated color in a photo-mechanical process. After the contact exposure, the non-exposed portion was washed with water to melt and remove it from the material to have an image formed thereon. This is included in the above stated step (1). The photo-sensitive material is selected for each of separation colors. For example, from a negative film corresponding to a cyanic color plate, the image of the film is contact reversed in the step (1), on the invented photo-sensitive material which has been colored to a cyanic color. After completion of the step (1), the photo-sensitive material permits color-proof work or the like thereon by an over-lay process. It is essential that the image obtained via the step (1) in accordance with the invention is transparent. In this instance, each of color tones (which basically include cyanic, magenta, yellow and black colors), must be close to that of a printing ink. It is also important that the color density is within a range from 0.5 to 1.5.

If the color tone differs far from that of the printing ink or if the color density is less than 0.5, an overlaid image obtainable therefrom would become much different in hue from a final printed image. Then, the color proof work cannot be satisfactorily accomplished. Further, if the color density should exceed 1.5, a great quantity of coloring agent would be required in the color layer. In that instance, not only the effective sensitivity would greatly be lowered by absorption of the active rays of light but also the image portion of the material would become inferior in light transmissibility. Then, when such materials are overlaid or superposed, the uppermost image color would be alone exaggerated and would become also too different from the final printed image. Therefore, such color density is hardly suitable for color proof work.

The light source to be used for exposing the photo-sensitive material according to the invention may be any kind of light source that is capable of effectively insolubilizing the color layer of the material. The light source may be selected from the group consisting of mercury lamps of varied kinds, a carbon-arc lamp, a xenon lamp, a metal halide lamp, a chemical fluorescent lamp, etc.

The use of the photo-sensitive material which has an image formed via the step (1) is not limited to proof work carried out by the overlay process. The material, after the proof work, can be used as a lith film. This is a great advantage of the invention.

The colored images obtained by the step (1) of the invented method are, as have been described in the foregoing, chiefly aimed at use for the proof work. Accordingly, each of the light transmissive (or transparent) images thus obtained is defined as to have its color density within the range from 0.5 to 1.5. This density is far lower than that density required for a lith film.

Therefore, to render it usable as a lith film, the above stated colored image is subjected to a further treatment at the above stated step (2) in which the image is further dyed with an aqueous solution of a dye. It must be noted here that, in accordance with the invention, the transparent colored image obtained from the photo-sensitive material has a capability to be readily dyed into an image of a higher degree of density by mere immersion of it in the above stated aqueous solution of a dye. With the dyeing process of the step (2) added, the transparent image is transformed into an opaque image. As a result, the material comes to have a second function to permit printing onto other lith films or PS plates or the like in the same manner as in ordinary contact reversing work. In order to have the second function, the image must have a light blocking property. More specifically, a degree of image density of at least 2.5 is required. With the components of the color layer of the photo-sensitive material defined according to the foregoing the required density is attainable without difficulty by immersing the material in the aqueous solution of a dye.

The dye to be used for this dyeing treatment may be selected out of a wide range of dyes including acid dyes and substantive dyes. With the mordanting means which is normally employed in the dyeing industry used for this purpose, the dyeing treatment can be carried out even with a basic dye. However, the dye must be selected in consideration of weather resistance, dyeability (a high degree of dye color density and a high dyeing velocity), etc. Normally, dyeing to a black or blackish color is preferable, although dyes of other colors can be likewise used. The dyeability varies with the kind of the dye used, the dye concentration of the dye solution and the temperature thereof, the kind and properties of the color layer of the photo-sensitive material according to the invention. However, the dyeability can be improved by adding to the aqueous solution of the dye a small amount of a dyeing assistant or a dyeing accelerator selected from organic solvents of alcohol, ether, glycol or other systems that have mutual solubility with water and surface active agents of varied kinds.

To further aid understanding of the invention, the following examples are given. These examples are intended to illustrate the invention and are not to be construed to limit the scope of the invention. In the examples, the blending amount expressed in "parts" indicates parts by weight. The values of optical transmission density were obtained by conducting measurement using a transmission densitometer Model DM-500 manufactured by Dainippon Screen Seizo K.K. either without using filters or with a red filter (Wratten No. 25), a green filter (Wratten No. 58) or a blue filter (Wratten No. 47) used for each of cyanic, magenta, yellow and black colors. The optical density within the range of active rays of light was measured with the blue filter (Wratten No. 47) also used for that purpose.

EXAMPLE 1

Intermediate layer forming solution:
10 parts vinylidene—acrylonitrile copolymer
100 parts methyl ethyl ketone
2 parts trichloroacetic acid
Color layer forming solution:
Solution A:
100 parts polyvinyl alcohol (average degree of polymerization 1700—2400, degree of saponification 98.5±0.5%), 10% aqueous solution
0.8 part a condensation product obtained from paradiazo-diphenyl amine and formaldehyde
4 parts a pigment dispersed solution (a 20% aqueous solution phthalocyamine blue)
100 parts water
10 parts iso-propyl alcohol
Solution B: Prepared by replacing the pigment dispersed solution with a 20% aqueous solution of Permanent Carmine FB in the composition of Solution A.
Solution C: Prepared by replacing the pigment dispersed solution with a 20% aqueous solution of Permanent Yellow HR in the composition of Solution A.
Solution D: Prepared by replacing the pigment dispersed solution with a 20% aqueous solution of carbon black in the composition of Solution A.

Each of these pigment dispersed solutions was prepared by carrying out a dispersing operation on the following composition over a period of three hours with an ink grinder:
60 parts pigment
1 part non-ionic active agent mainly consisting of polyethylene glycol and alkyl phenyl ether
240 parts water The above stated intermediate layer forming solution was applied to one side of a biaxially stretched film of polyethylene terephthalate measuring 100μ in thickness. The coating thus obtained was dried at 100° C. for one minute to obtain an intermediate layer measuring about 1μ in thickness.

With the intermediate layer thus formed, the solution A for forming the color layer was applied onto the intermediate layer with a Meyer bar (wire rod) to have a dried coating thickness of 3μ. The coating was dried for one minute by means of a dryer blowing air of 80° C. By this process, a film I which ws colored to a cyanic color was obtained.

Following that, films II, III and IV which were respectively colored to magenta, yellow and black colors were obtained with the solutions B, C and D used in exactly the same manner as in the case of the solution A.

A negative film which was a color separated half-tone negative for a cyanic plate was brought into close contact with the colored photo-sensitive surface of the above stated film I. An exposure was carried out for a period of 20 seconds with a high voltage mercury lamp of 2 KW arranged at a distance of one meter. After the exposure, the non-exposed portion of the photo-sensitive surface was removed by washing the film I with water of normal temperature spouting out of a nozzle under pressure of 1 kg/cm². After completion of washing, water was removed and then the film I was dried with warm air of 50° C. to obtain a positive image which was colored into a cyanic color.

A negative film for a magenta plate was used for the film II, a negative film for an yellow plate for the film III and a negative film for a black plate for the film IV. With the different negative films thus used for the films II, III and IV, the same process was carried out with the exposure time alone arranged to be different and set at 30, 40 and 60 seconds respectively. Three kinds of positive images colored into magenta, yellow and black colors were thus obtained. Each of these films excelled in close contacting property and resolving power. The transmission color density of their images were 0.72, 0.75, 0.58 and 0.70. The four films which had colored positive images of different colors were then overlaid or superposed on top of each other and examined on a white paper. Under that condition, they composed a color image which was very close to a final printed image. In other words, these films were found useful for proof work and checking.

After that, each of the films having the colored images was immersed in a dye solution of the following composition over a prescribed length of time. The immersed film was then washed with water. After removal of water they were dried with warm air of 50° C. Through this process, all the four films came to have sharp black images.

Dye solution:
30 parts of Direct Fast Black B 160
5 parts of ethylene glycol
1000 parts of water
Temperature of the dye solution: 50° C.
Dyeing time: 2 minutes All the black images of four different kinds obtained in this example excelled in close contacting property and resolving power. They excelled also in dot reproducibility and exceeded 2.5 in image density. Further, the density of the background portion (non-image forming portion) of each of them was less than 0.1. Using these films as originals, they were printed on commercially available PS plates to obtain each color separation plate. Then, using an offset printing proof press, four-color printing was carried out to obtain a good result. In other words, it was found through the experiments of this example that these films, which were arranged to have the black images in accordance with the invention, are capable of performing the same function as the conventional lith films.

EXAMPLE 2

Color layer forming solution:
Solution E:
100 parts a 15% aqueous solution of polyacrylamide having viscosity 20,000 cps at 20° C.
1 part condensation product of para-diazo-diphenyl amine and formaldehyde
12 parts pigment dispersed solution (a 20% aqueous dispersion solution of phthalocyanine blue)
180 parts water
20 parts iso-propyl alcohol
Solution F: Prepared in the same manner as in the case of the solution E with the exception of that the pigment dispersed solution alone was replaced with a 20% aqueous dispersion solution of Permanent Carmine FB.
Solution G: Prepared in the same manner as in the case of the solution E with the exception of that the pigment dispersed solution was replaced with a 20% aqueous dispersion solution of Permanent Yellow HR.
Solution H: Prepared in the same manner as in the case of the solution E with the exception of that the pigment dispersed solution was replaced with a 20% aqueous dispersion solution of carbon black.

In this example, the procedures up to the formation of the intermediate layer were identical with those of Example 1. After that, the color layer forming solution E was applied onto the intermediate layer by means of a Meyer bar (wire rod) to obtain a coating thickness of 3μ after drying. The color layer thus applied was dried for one minute with a dryer blowing air of 80° C. A film V was obtained in this manner. Then, films VI, VII and VIII were obtained using the solutions F, G and H in the same manner. These films were then printed in the same manner as in the case of Example 1. They were subjected to the same water washing and developing process to obtain positive images colored in cyanic, magenta, yellow and black colors. The preferable periods of time for printing on these films V, VI, VII and VIII were respectively 30, 40, 50 and 70 seconds.

The degrees of transmission color density of these images were respectively 1.20, 1.13, 0.98 and 1.18. Their dot reproducibility was also satisfactory. The four kinds of films having the colored positive images were overlaid on top of each other with their register marks adjusted. A fluorescent lamp light was applied from the reverse side of the overlaid films for observation. Through this observation, it was confirmed that the overlaid image thus observed very closely resembled a final printed image and that these films were effectively usable for proof work.

Further, these films were immersed for two minutes in the dye solutions shown in Example 1 above. Sharp black positive images all exceeding 3.0 in density were obtained through this immersion process. Each of these black positive images excelled in the close contacting property, water resistance and resolving power and were thus effectively used as mask films for a photo-mechanical process.

EXAMPLE 3

In this example, experiments were conducted in exactly the same manner as in Example 1 with the exception of that the 10% aqueous solution of polyvinyl alcohol included in the color layer forming solution was replaced with a 10% aqueous solution of gelatin (a product called S-778 manufactured by K.K. NIPPI) and that the color layer forming solution was heated to 40° C. before it was applied. The results thus obtained were similar to those obtained in Example 1.

EXAMPLE 4

Experiments were conducted in exactly the same manner as in Example 2 with the exception of that the 15% aqueous solution of polyacrylamide included in the color layer forming solution of Example 2 was replaced with a 15% aqueous solution of an acrylamide - diacetone acryl amide copolymer (the copolymerization ratio of 6:4 and average polymerization degree 1000). Then, through the same process as in Example 2, films having the combined functions as film for proof work and as lith film were likewise obtained.

Further, similar results were also obtained with the dye solution alone changed to be of the following composition:
Dye solution:
30 parts of an acid dye called Cibalan Black BGL
5 parts of ethylene glycol
1000 parts of water.

What is claimed is:

1. An image forming process comprising:
   (a) providing a color layer upon a transparent base material, said color layer comprising a film-forming, water soluble, high molecular weight polymer, a photosensitive material which reacts with said polymer when exposed to light to insolubilize said polymer; and a coloring agent corresponding to the color to be printed from the separation plate, said coloring agent being used in a concentration such that the optical transmission density of the color layer is between 0.5 and 1.5 after exposure to light;
   (b) superimposing upon said color layer a color separated negative film of the original image which is to be printed;
   (c) exposing said color layer to light through said negative film;
   (d) washing said color layer and base material with water to remove non-exposed, water-soluble portions and to form a color image;
   (e) proofing said color image against a background; and
   (f) dyeing said proofed color image with a dye such that the optical density of the color image is at least 2.5 within the range of the active rays of light.

* * * * *